(12) United States Patent
Peng et al.

(10) Patent No.: US 8,259,518 B2
(45) Date of Patent: Sep. 4, 2012

(54) LOW VOLTAGE AND LOW POWER MEMORY CELL BASED ON NANO CURRENT VOLTAGE DIVIDER CONTROLLED LOW VOLTAGE SENSE MOSFET

(75) Inventors: Jack Z. Peng, San Jose, CA (US); David Fong, San Jose, CA (US)

(73) Assignee: Sichuan Kiloway Electronics Inc., Mian Yang, Sichuan (CN)

( * ) Notice: Subject to any disclaimer, the term of this patent is extended or adjusted under 35 U.S.C. 154(b) by 199 days.

(21) Appl. No.: 12/796,031

(22) Filed: Jun. 8, 2010

(65) Prior Publication Data

US 2011/0299344 A1    Dec. 8, 2011

(51) Int. Cl.
*G11C 7/00*         (2006.01)

(52) U.S. Cl. .............. 365/189.2; 365/189.011; 365/149; 365/230.06

(58) Field of Classification Search ............... 365/189.2, 365/189.011, 149, 230.06
See application file for complete search history.

(56) References Cited

U.S. PATENT DOCUMENTS

| | | | |
|---|---|---|---|
| 5,930,161 A * | 7/1999 | Sheikholeslami et al. . | 365/49.13 |
| 6,320,777 B1 * | 11/2001 | Lines et al. ................. | 365/49.12 |
| 6,529,397 B2 * | 3/2003 | Takeda et al. .................. | 365/63 |
| 6,731,526 B2 * | 5/2004 | Inoue .......................... | 365/49.17 |
| 6,795,325 B1 * | 9/2004 | Inoue .......................... | 365/49.17 |
| 7,499,302 B2 * | 3/2009 | Patel .......................... | 365/49.12 |

* cited by examiner

*Primary Examiner* — Pho M Luu
(74) *Attorney, Agent, or Firm* — Jingming Cai; Schein & Cai LLP (57) ABSTRACT

A memory cell has at least two word lines and at least two bit lines. The cell also has a first select device being connected to at least one word line and one bit line and a gate capacitor element connected to at least one word line and the first select device. The cell also has a sense device being connected in series to the gate capacitor element and the first select device. The sense device is connected to at least two bit lines.

4 Claims, 11 Drawing Sheets

| | Cell | V(WP) | V(WS) | V(BL) | V(BR) |
|---|---|---|---|---|---|
| Programming | A SW/SB | 5.5V | 2.5V | 0V | 0V |
| | B SW/UB | 5.5V | 2.5V | 2.5V | 2.5V |
| | C UW/SB | 2.5V | 0V | 0V | 0V |
| | D UW/UB | 2.5V | 0V | 2.5V | 2.5V |
| Read | A SW/SB | 1.0V | 0V | 0V | V Sensing(+) |
| | B SW/UB | 1.0V | 0V | 0V | 0V |
| | C UW/SB | 0V | 0V | 0V | V Sensing(+) |
| | D UW/UB | 0V | 0V | 0V | 0V |
| | | | | | Sensing Line |

FIG. 5

| | Cell | | V(WP) | V(WS) | V(BL) | V(BR) |
|---|---|---|---|---|---|---|
| Programming | A | SW/SB | 5.5V | 2.5V | 0V | Floating |
| | B | SW/UB | 5.5V | 2.5V | 2.5V | Floating |
| | C | UW/SB | 2.5V | 0V | 0V | Floating |
| | D | UW/UB | 2.5V | 0V | 2.5V | Floating |
| | | | | | | |
| Read | A | SW/SB | 1.0V | 0V | 0V | V Sensing(+) |
| | B | SW/UB | 1.0V | 0V | Floating | Floating |
| | C | UW/SB | 0V | 0V | 0V | V Sensing(+) |
| | D | UW/UB | 0V | 0V | Floating | Floating |
| | | | | | | Sensing Line |

LOW VOLTAGE AND LOW POWER MEMORY CELL BASED ON NANO CURRENT VOLTAGE DIVIDER CONTROLLED LOW VOLTAGE SENSE MOSFET

FIELD OF THE INVENTION

The present disclosure is directed to a low voltage and low power XPM cell. More particularly, the present disclosure is directed to the field of one-time programmable (OTP) nonvolatile memory cells based on gate oxide soft or hard breakdown phenomena and to more particularly to a low power and low voltage memory cell.

BACKGROUND OF THE RELATED ART

Nonvolatile memory retains stored data when power is removed, which is desirable in the art particularly with cameras, RFID circuits and the like. One commonly available type of nonvolatile memory is the programmable read-only memory ("PROM"), which uses wordline-bitline crosspoint elements. These may include fuses, anti-fuses, and trapped charge devices (for example, floating gate avalanche injection metal oxide semiconductor ("FAMOS") transistor) to store logical information. The term "crosspoint" refers to the intersection of a bitline and a word line.

An example of one type of PROM cell that uses the breakdown of a silicon dioxide layer in a capacitor to store digital data is disclosed in U.S. Pat. No. 6,215,140 to Reisinger et al., which is herein incorporated by reference in its entirety. The basic PROM disclosed by Reisinger et al. uses a series combination of an oxide capacitor and a junction diode as the crosspoint element. An intact capacitor represents the logic value 0, and an electrically broken-down capacitor represents the logic value 1. The thickness of the silicon dioxide layer is adjusted to obtain the desired operation specifications. Examples of such XPM cells may include U.S. Pat. No. 6,667,902 to Peng, No. 6,700,151 B2 to Peng, No. 6,798,693 B2 to Peng and No. 6,650,143 B1 to Peng, which are all incorporated by reference in its entirety.

Improvements in the various processes used for fabricating the different types of nonvolatile memory tend to lag improvements in widely used processes such as the advanced CMOS logic process as disclosed in U.S. Published patent application No. 2010/0091545 to Jack Z. Peng et al., which is herein incorporated by reference in its entirety.

Prior art XPM cells (such as, for example, U.S. Pat. No. 6,667,902 to Peng, No. 6,700,151 B2 to Peng, No. 6,798,693 B2 to Peng and No. 6,650,143 B1 to Peng) have certain minimum requirements that may not be favored in certain applications. For example, prior art XPM cells require a programmed gate oxide (Gate capacitor) in the hard breakdown to achieve low resistance to provide enough cell read sense current (1~10 uA). Additionally, prior art XPM cells also require a very high read voltage (Vwp) or a voltage that is >2.5~3.3V (because the prior art needs a large voltage drop over the high resistance of breakdown gate oxide). For example, such parameters may include 1~10 uA×500K ohms=0.5~5V. In the cased of 3M ohms, it will cause a 3~10V drop. So some high resistance cells could not be read out with appropriate levels for a signal to be generated. These examples indicate several disadvantages with the prior art memory technologies.

There is a need in the art for a XPM cell that can achieve improved performance and remedy the deficiencies in the prior art.

SUMMARY OF THE INVENTION

According to a first aspect of the present disclosure, there is provided a memory circuit comprising at least two word lines and at least two bit lines. The circuit also has a first select device being connected to at least one word line and one bit line and a gate capacitor element connected to at least one word line and the first select device. The circuit also has a sense device being connected in series to the gate capacitor element and the first select device. The sense device is connected to at least two bit lines.

According to another aspect there is provided a memory circuit. The memory circuit comprises at least two word lines and at least two bit lines. The memory circuit also has a first select device being connected to at least one word line and one bit line and a gate capacitor element connected to at least one word line and the first select device. The memory circuit also has a second sense device being connected in series to the gate capacitor element and the first select device. The second sense device is connected to at least two bit lines. The gate capacitor element comprises a memory cell being selected from the group consisting of a ROM, an EPROM, an EEPROM, a Flash memory cell, a PCRAM, a FCRAM, an MRAM, and an anti-fuse element.

According to yet another aspect there is provided a circuit comprising at least two word lines, at least two bit lines and a first select device being connected to at least one word line and one bit line. The circuit also has a gate capacitor element connected to at least one word line and the first select device and a second sense device connected in series to the gate capacitor element and the first select device. The second sense device is connected to at least two bit lines. The gate capacitor element is a P type field effect transistor, and the select device is a P type field effect transistor and the sense device is P type field effect transistor.

In yet a further embodiment there is provided a memory circuit that has at least two word lines and at least two bit lines. The memory circuit also has a first select device connected to at least one word line and one bit line and a gate capacitor element connected to at least one word line and the first select device and a sense device. The sense device is connected in series to the gate capacitor element and the first select device. The sense device is connected to at least two bit lines. The memory also has a decoder circuit connected to the sense device and an amplifier being connected to the decoder circuit.

In a further embodiment of the present disclosure there is provided a circuit. The circuit has a first word line, a second word line, a first bit line and a second bit line. The circuit has a first select device connected to the second word line and the first bit line and a gate capacitor element connected to the first word line and the first select device. The circuit also has a sense device being connected in series to the gate capacitor element and the select device. The sense device is connected to the first bit line and the second bit line. The circuit further has a decoder circuit being connected to the sense device and the first select device and a current limiting circuit connected to the decoder circuit. The gate capacitor element is a field effect transistor. The first select device is a field effect transistor and the sense device is a field effect transistor.

In yet a further embodiment of the present disclosure there is provided a method comprising providing a first transistor connected to a first word line and providing a second transistor connected to a second word line. The method further provides a third transistor connected to the first and the second transistor and connected to a first and a second bit line. The method programs by elevating the first word line to a predetermined voltage and switching on the second word line and grounding the first bit line for a predetermined time period.

BRIEF DESCRIPTION OF THE FIGURES

The foregoing and other objects, features and advantages of the invention will be apparent from the following more particular description of preferred embodiments of the invention, as illustrated in the accompanying drawings in which like reference characters refer to the same parts throughout different views. The drawings are not meant to limit the invention to particular mechanisms for carrying out the invention in practice, but rather, are illustrative of certain ways of performing the invention. Others will be readily apparent to those skilled in the art.

DETAILED DESCRIPTION OF THE PREFERRED EMBODIMENTS

The embodiments explained in this description disclose one-time programmable (OTP) nonvolatile memory cells. The disclosed memory cells occupy small areas and are optimized for low bit count applications. These memory cells can be used for code storage memories, serial configuration memories, and as individual fuse bits for ID (identification), trimming, and other post-fabrication System-on-Chip (SoC) customization needs. It should be appreciated that the memory cell may include other embodiments as described herein.

In general, to program one of these memory cells, a high voltage is applied to a specific transistor of the memory cell to break down the transistor (blow the fuse). For reading the fuse memory cell, the current passing through the transistor is sensed. The current passing through the fuse is an indication of its data content, a "1" or a "0," depending on the agreed convention.

Figure 1A:
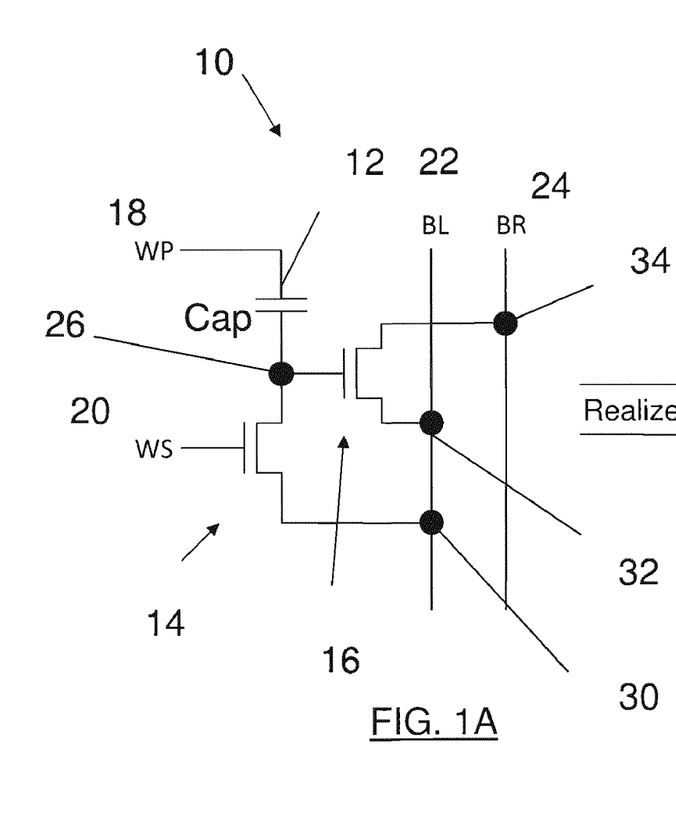
FIGS. 1A-1B show an XPM memory cell according to the present disclosure.
Figure 1B:
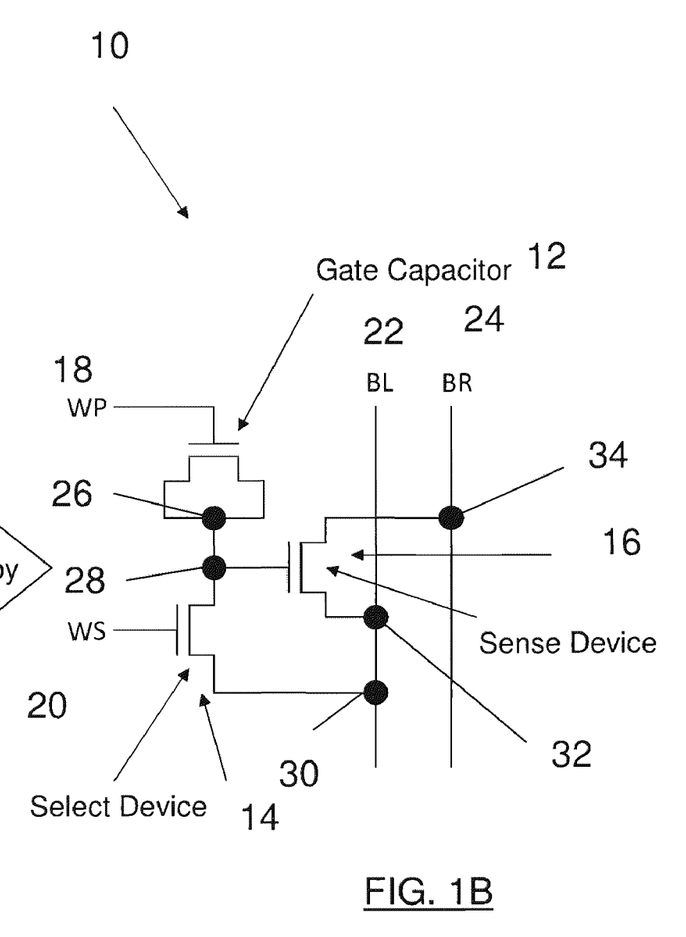
Figure 1C:
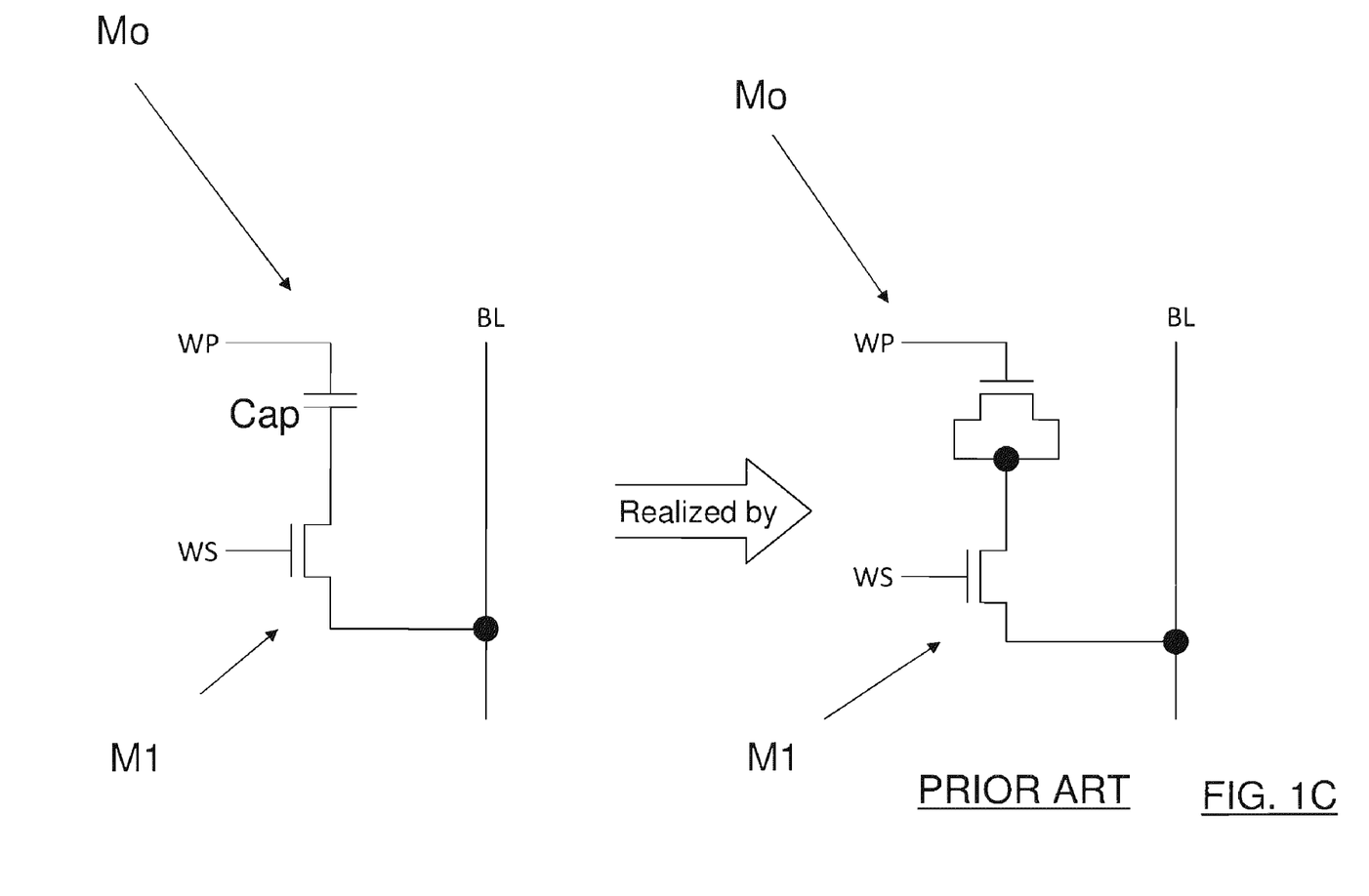
FIG. 1C shows a prior art memory cell.

A prior art configuration of an XPM memory cell of Kilopass Technologies®, Inc. in Santa Clara, Calif. is illustrated in FIG. 1C and which is discussed in U.S. Published patent application No. 2010/0091545 which was previously incorporated by reference. The fuse memory cell of FIG. 1C includes a "select" transistor M1 and a programming transistor Mo, both of which can be fabricated using standard CMOS processes without additional masking. In this memory cell, transistor M1 acts as a switch and Mo acts as a current limiter, wherein the current passing through M0 is an indication of its programmed logic level (data content). The gate of the programming transistor M0 acts as one plate of a capacitor and the application of the voltage to the gate causes an inversion layer to form under the gate. This acts as the other plate of the capacitor and together with the source/drain region forms the second terminal of the capacitor. Since it is undesirable to break down the gate oxide of the select transistor M1, the gate oxide of the select transistor M1 may be made, in some embodiments, to have a thicker gate oxide than that of the programming transistor M0 as discussed in U.S. Published patent application No. 2010/0091545.

For programming the memory cell of FIG. 1C, WP is elevated to VPP (a predetermined high voltage), WS is turned ON, and the BL is grounded, for a specified duration of time (e.g., 50 us), to break down the gate oxide of the programming transistor Mo. This arrangement sets the leakage current level of the memory cell and, therefore, its logic level.

For reading the content of the memory cell, appropriate voltage is applied to the gates of Mo and M1 transistors, which connects Mo to the bit-line BL. Thereafter, to classify the logic level of the memory cell, the current passing through M1 and BL, which is limited by Mo, is sensed by a sense amplifier (not shown). Turning now to FIGS. 1A and 1B, the present disclosure preferably is operable for use with an XPM cell or memory array 10. XPM cell 10 preferably includes a gate capacitor element 12, and a number of devices 14 and 16. The XPM cell 10 also receives signals from lines WS 18, WP 20 and BL 22, and BR 24. BL 22 and BR 24 are a bit lines and WS and WP 18 and 20 are word lines and the memory elements are formed between the word lines and the bit lines.

Preferably, the XPM cell 10 includes a Field-effect transistor or gate capacitor element 12 being connected to a node 26, which is connected to a second node 28 shown in FIG. 1B, which is connected to first device 14. The first device 14 is a select device and is connected to node 28. The first device 14 is preferably a Field-effect transistor. The first device 14 is also connected to the word line 20 and the bit line 22 by node 30 as shown in FIG. 1B.

The second device 16 is a sense device. The second device 16 is connected to the bit line BL 22 at node 32 and the bit line BR 24 at node 34. The second device 16 is also Field-effect transistor. Second device 16 is connected to the gate capacitor element 12 and the select device 14. The gate capacitor element 12 is connected to the word line 18 and is connected to node 26 and devices 14 and 16. It should be appreciated that the devices 14 and 16 may be other devices that those shown above and may include (less preferably) at least one of a DEPFET, a DGMOSFET, a FREDFET, a HEMT, a MOSFET or other devices.

Figure 7:
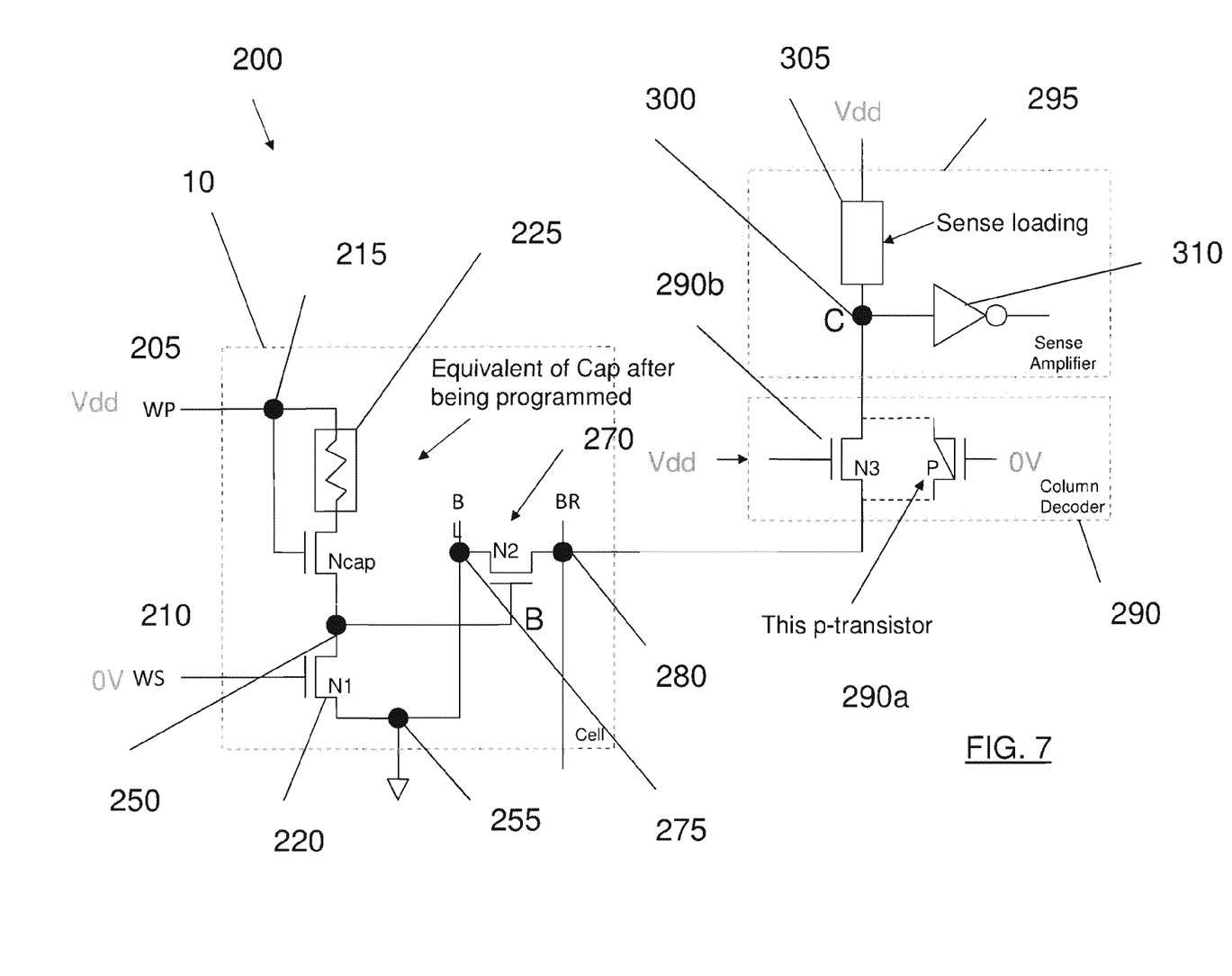
FIG. 7 shows the memory cell connected to a column decoder and a sense amplifier for illustrating a sensing scheme of the present disclosure.

In the circuit 10 shown in FIGS. 1A and 1B, the cell 10 is shown as an unprogrammed cell with no sense current traversing through either device 12, device 14 or device 16 and the cell 10 is in the so called "0" status. FIG. 7 shows the equivalent circuit 200 of capacitance after being programmed with the gate oxidized breakdown, so there is current traversing through element 255 and NCap device 225 to raise the voltage at point B 275, which is the gate of the device 270.

Accordingly, the circuit 10 does not require a programmed gate oxide in a hard breakdown state and a programming current can be greatly reduced (from a few hundred uA to a few uA). After the device 12 been programmed or gate oxide been programmed or breakdown (either soft or hard breakdown), current is conducted through circuit 200 as shown in FIG. 7. In order to program the circuit 200 and breakdown a gate oxide a current of 1 to 5 uA is needed, this is in contrast with the prior art of Kilopass's XPM technology, which requires about 50 to about 150 uA to program each bit.

In case of sensing the memory cell, the current passing through gate capacitor element 12 is only about 1 nA. In other words, the select device 14 has a source to drain resistance much larger than 100M ohms during an off stage wherein Vws=0V. The programmed (breakdown) gate oxide has resistance of less than 10M, so resistor voltage divider formed by capacitor element and off state select device 14 will turn on the sense device 16.

For programming the memory cell of FIGS. 1A and 1B, WP is elevated to VPP (a predetermined high voltage), WS is turned ON, and the BL is grounded, for a specified duration of time (e.g., 50 us), to break down the gate oxide of the device 12. This arrangement sets the leakage current level of the memory cell 10 and, therefore, its logic level. For reading the content of the memory cell 10, appropriate voltage is applied to the gates of elements 12 and 14, which connects device 12 to the bit-line BL. Thereafter, to classify the logic level of the memory cell 10, the current passing through device 12 and BL, which is limited by device 12, is sensed by a sense amplifier (not shown).

In the cell 10 of FIGS. 1A and 1B, only ~1 nA traverses through the programmed gate oxide 12 to turn on the controlled sense device gate 16. In the case of very high resistance of 1M ohms, its voltage drop is only about 1 nA*1M ohms=1 mV. So the voltage Vwp applied to line WP 18 requires only about 0.5V to turn on the sense device gate 16. Also, the sense device 16 is a regular low voltage device, and can operate at a voltage Vds=0.5V to provide 1~10 uA. So, the circuit 10 can have read voltage Vwp as low as 0.5~1V. In this manner, the present disclosure can be operable for use with very low voltage as compared to the circuit 10 of FIG. 1C and can be used with low power applications, such as RFID memory, which is advantageous.

Figure 2A:
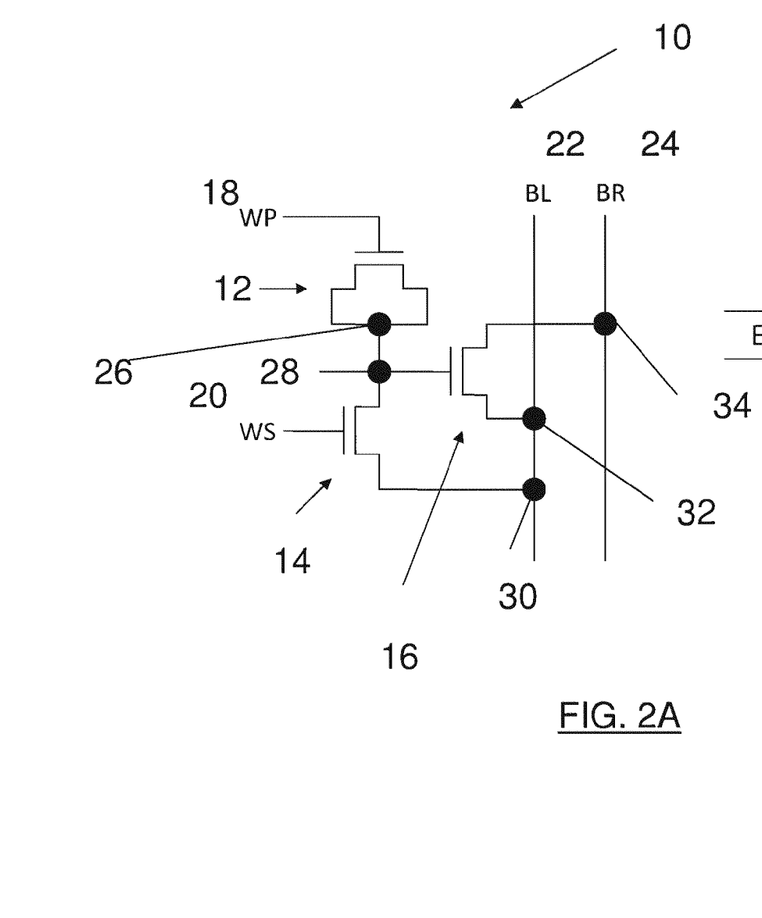
FIGS. 2A-2B show a memory cell of a different embodiment.
Figure 2B:
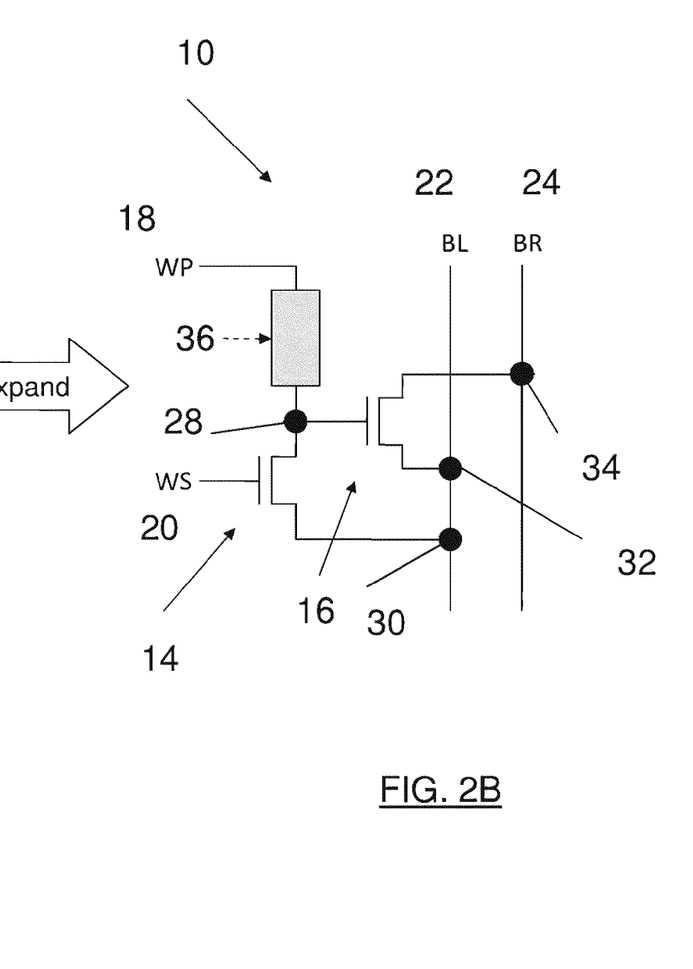

Turning now to FIGS. 2A and 2B, there is shown an alternative embodiment of the present memory cell 10. As can be seen from FIG. 2B, the memory cell 10 has an element 36 wherein the element 36 can be any number of devices, such as, for example, ROM, EPROM, EEPROM, Flash memory, PCRAM, FCRAM, MRAM, an anti-fuse element and any other memory cell or memory element known in the art. Preferably, the element 36 is connected to node 28 and the word line WP 18. Node 28 is connected to select device 14, which preferably is a Field effect transistor. Device 14 is connected to bit line BL 22 at node 30. Node 28 is also connected to second device 16 which is connected to node 32 and node 34. Second device 16 is preferably a sense device and is a Field effect transistor 16. Node 32 is connected to bit line BL 22. Node 34 is connected to bit line BR 24. Element 36 may require an extra control voltage however, this arrangement is optional and the element 36 alternatively may not require any auxiliary voltage. Various configurations are possible and within the scope of the present disclosure.

Figure 3A:
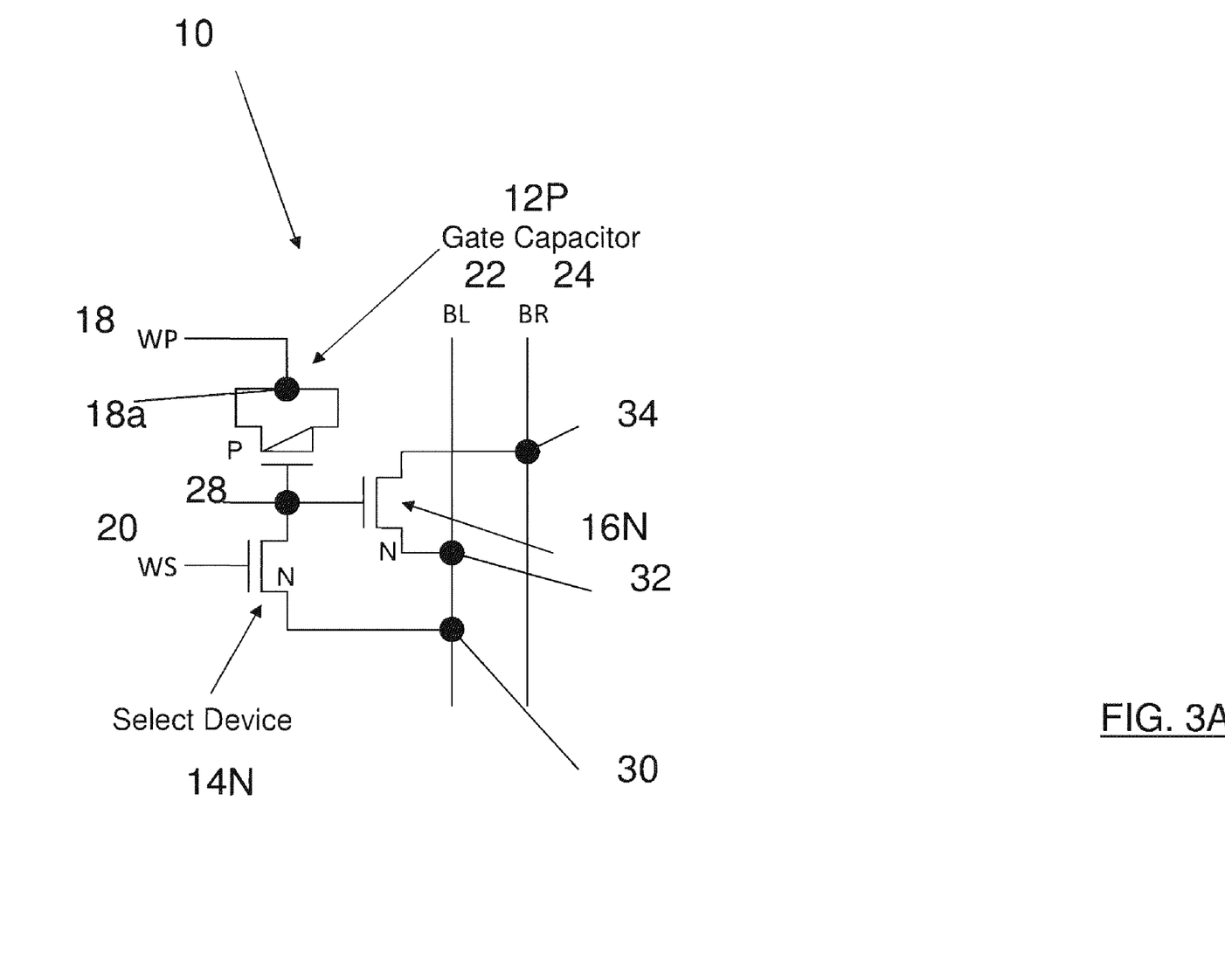
FIGS. 3A-3B show a memory cell including a P and N implementation and a P implementation.
Figure 3B:
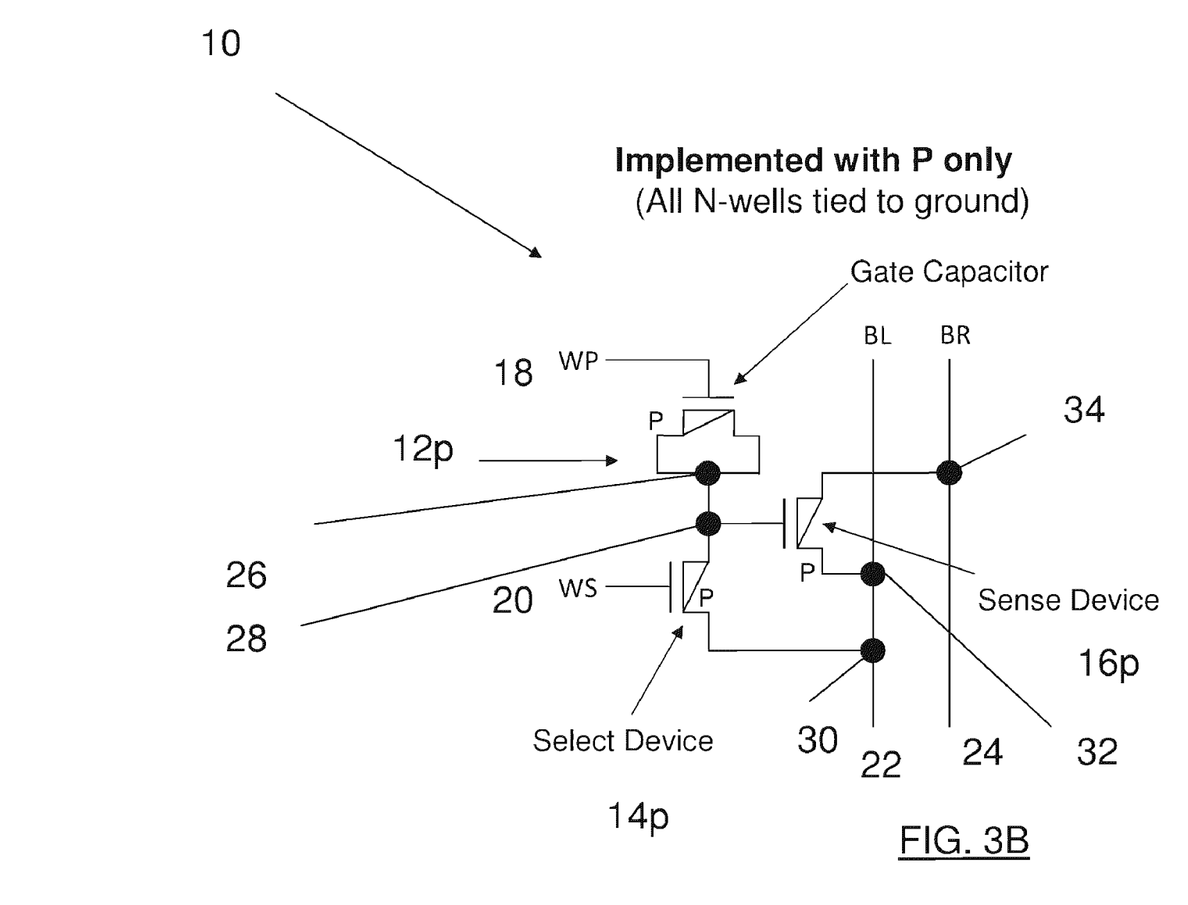

Turning now to FIGS. 3A and 3B, there is shown another alternative embodiment of the memory cell 10. In FIG. 3A, there is shown a P and N configuration of the memory cell 10. In FIG. 3B, there is shown a P only configuration with the N wells of the elements connected to ground. FIG. 3A shows a configuration of memory cell 10 wherein the word line WP 18 is connected to a gate capacitor element 12P by a node 18a. Element 12P is preferably a Field effect transistor 12P.

As shown, the gate capacitor element 12P is of the P configuration and is inverted relative to FIG. 1A and FIG. 1B. The gate capacitor element 12P is connected to node 28. Node 28 is connected to the first select device 14N, which is an N configuration device. First select device 14N is also a Field effect transistor 14N. First device 14N is connected to the word line WS 20 and is connected to the bit line BL 22 at node 30.

The second device 16N is a sense device. The second sense device 16N is connected to the node 28 and the node 32. Node 32 is connected to the bit line BL 22. The second sense device 16N is further connected to node 34. Node 34 is connected to the bit line BR 24. Second sense device 16N is also a Field effect transistor 16N. In the configuration of FIG. 3A, the gate capacitor element 12P is of the P type while the first and the second devices 14N and 16N are of the N type.

Turning now to FIG. 3B, there is shown the circuit 10 being implemented with the P type elements 12P, 14P, and 16P only and the N wells of the elements being tied to ground. In FIG. 3B, as can be understood, the gate capacitor 12P is inverted relative to FIG. 3A and is shown being connected to the word line WP 18. The gate capacitor element 12P is also connected to node 26. Node 26 is connected to node 28. Node 28 is connected to the first select device 14P which is of the P type. First select device 14P is a Field effect transistor. The first select device 14P is connected to the word line WS 20 and is connected to the node 30, which is connected to the bit line BL 22.

The second device 16P is the sense device and is of the P type. The second device 16P is connected to node 28 and gate capacitor element 12P and first device 14P. The second device 16P is also connected to the bit line BR 24 by node 34 and bit line BL 22 by node 32. The second device 16P is also a Field effect transistor. The programming voltages and read voltages are shown in a table format in FIG. 9. The programming voltages range from −5.5 Volts to −2.5 Volts while the read voltages are in the range of −1.0 Volts. Preferably, the arrangement of FIG. 3B is more preferred than the arrangement of FIG. 3A.

Figure 4:
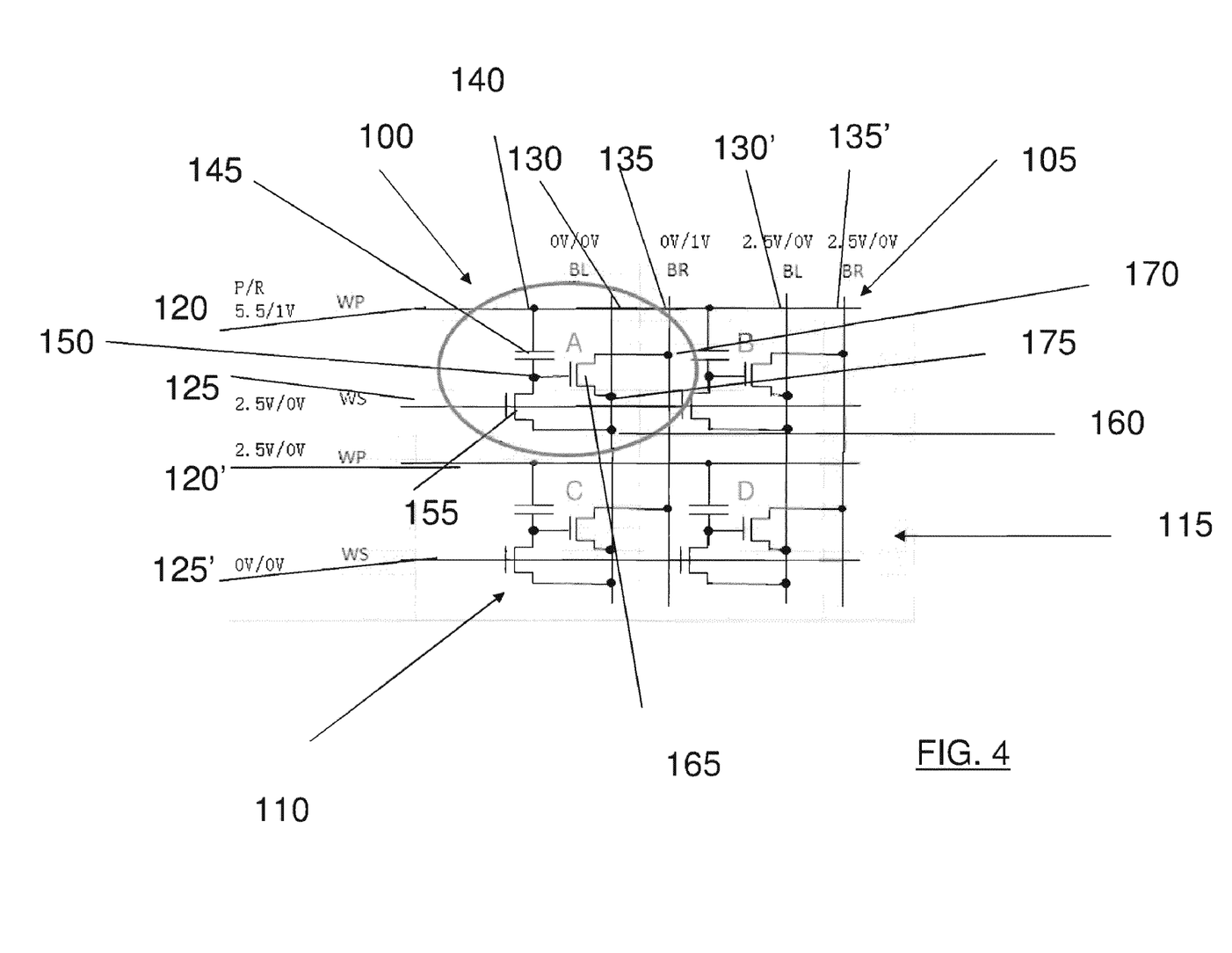
FIG. 4 shows a number of memory cells in a cell array architecture.

FIG. 4 shows a circuit diagram of a cell architecture for a 0.13 μm CMOS process according to the present disclosure. FIG. 4 shows an arrangement with a first cell 100, a second cell 105, a third cell 110 and a fourth cell 115. The first cell 100 is connected to the first word line 120 (5.5 Volts/1 Volt) and a second word line WS 125 (2.5 Volts/0 Volts). The first cell 100 also is connected to two bit lines, or a first bit line BL 130 (0 Volts/0 Volts) and a second bit line BR 135 (0 Volts/1 Volt). The cell architecture also includes third and fourth bit lines 130' and 135' and third and fourth word lines 120' and 125'. Each of the cells 100-115 include a similar configuration with a node 140 being connected to a gate capacitor element 145 (Field effect transistor). The node 140 is connected to the word line WP 120. The gate capacitor element 145 is also connected to node 150. Node 150 is connected to the first device 155 (Field effect transistor), which is connected to the word line WS 125. First device 155 is a select device 155 and is connected to node 160. Node 160 is connected to the bit line BL 130.

The circuit 10 also includes a second device 165 (Field effect transistor). Second device 165 is a sense device 165 and is connected to the first bit line BL 130 at node 175 and is connected to the second bit line BR 135 at node 170. The first cell 100 is assumed to be operating and being programmed or being read. Preferably, about 5.5/1V is applied to word line 120 or 5.5 volts is applied to the word line WP 120 in a programming mode and 1 volt is applied in a reading mode. Second device 165 is a sensing device and is connected to node 150 and connected to the first device 155 and the gate capacitor element 145 in series.

Figure 5:
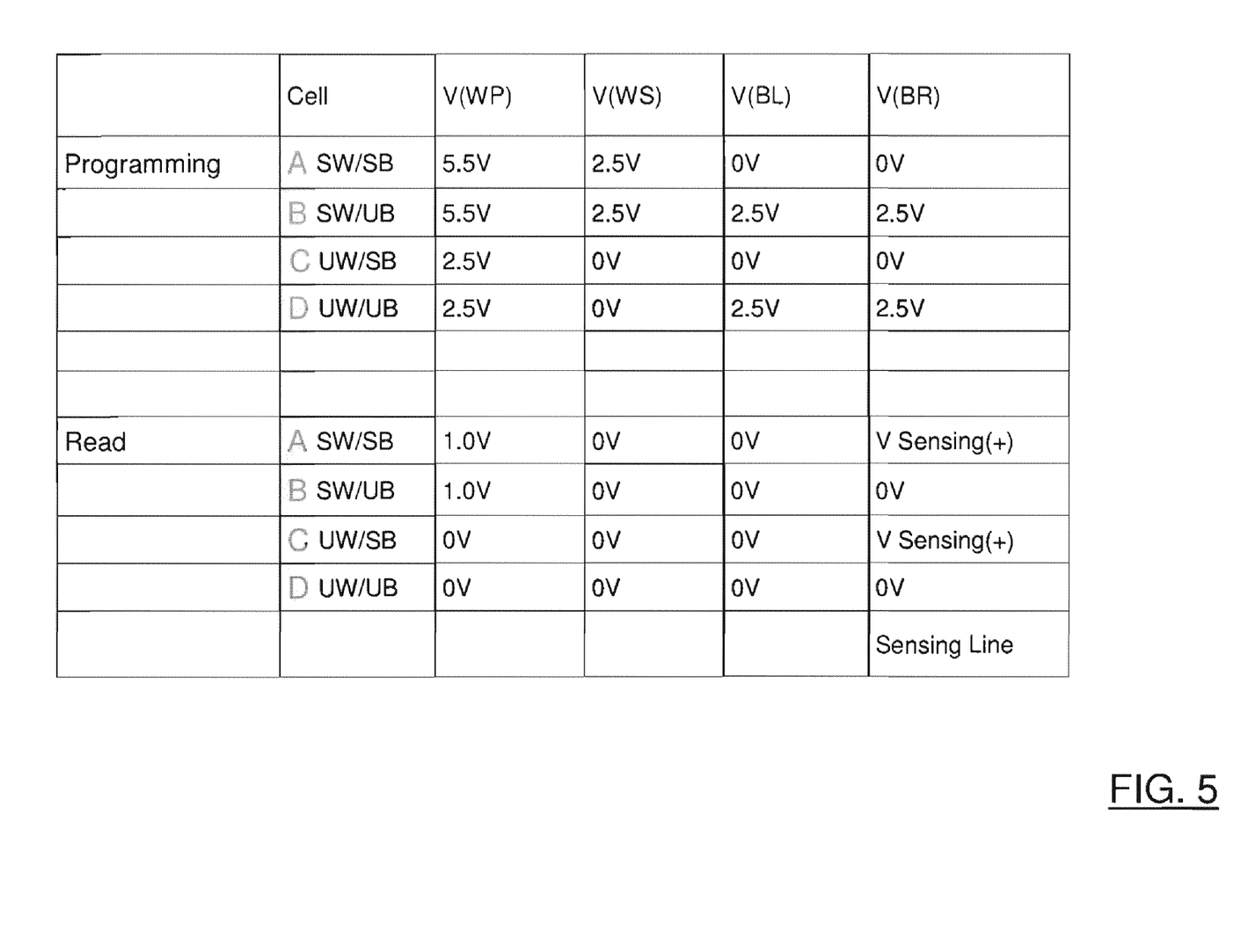
FIGS. 5-6 show a number of tables of operation voltage conditions for the array of FIG. 4.
Figure 6:
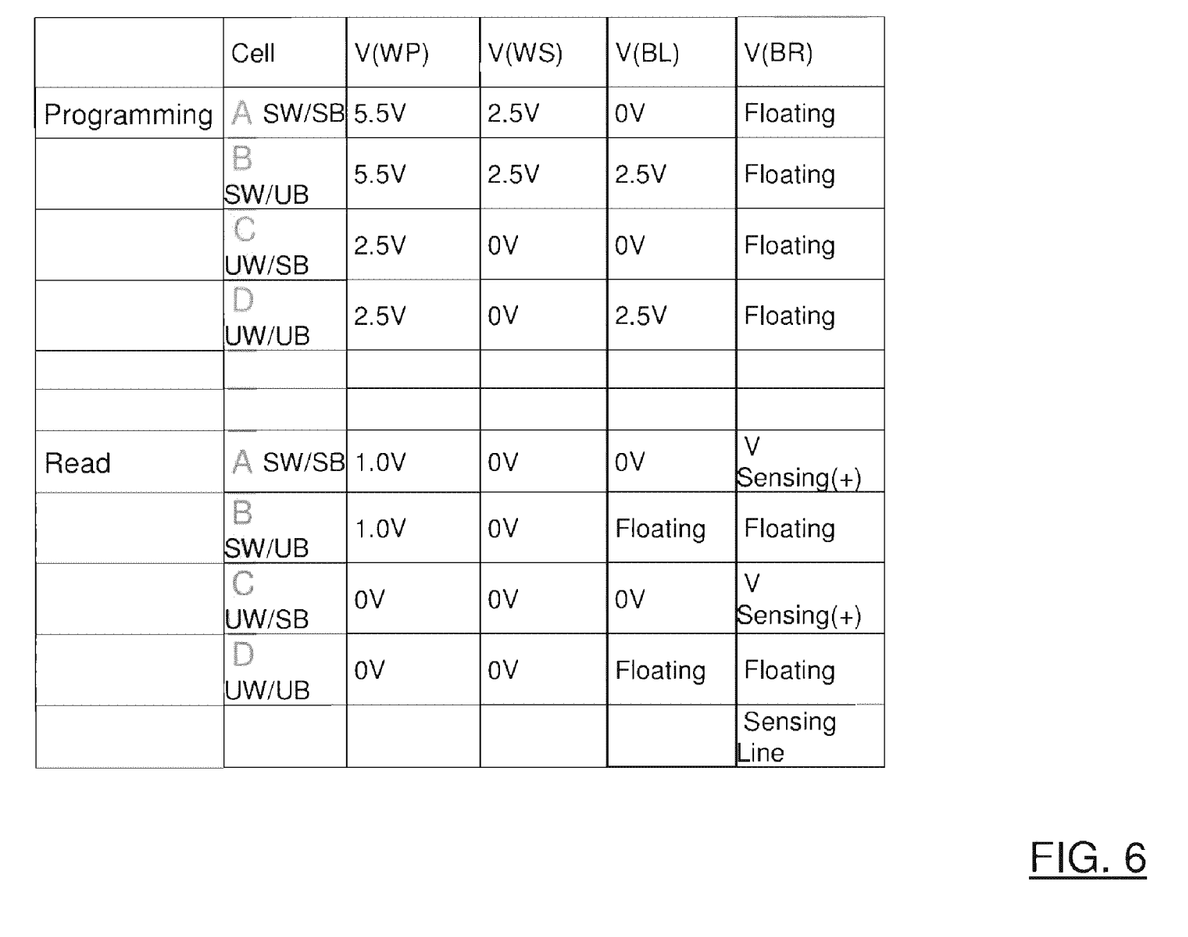

Preferably, each memory cell 100, 105, 110 and 115 is connected to two word lines 120, 125 and 120' and 125' and two bit lines 130 and 135 and 130' and 135' as shown in a similar manner that discussed for memory cell 100. FIG. 5 shows a table of operation voltages for the cell 100 shown in FIG. 4 for a 0.13 μm process technology cell architecture. A "SW/SB" notation is defined as the circuit A which is located at the selected word lines and bit lines. FIG. 6 assumes the bit line BR 135 to be a sensing line, however this is not limiting and BL 130 may alternatively be the sensing line. Various operational voltages are possible within the scope of the present disclosure and depending on the cell. FIG. 6 shows an alternative embodiment of voltage conditions for the cell 100 for the architecture shown in FIG. 4. Preferably, the transistor types can include p type or n type transistors or mixed type transistors and the voltage level may match the requirement of any specific process technology and the voltage can be positive or negative. Preferably, the voltage values shown in FIGS. 5 and 6 are merely illustrative of only one embodiment of the present disclosure and various other operation voltage conditions are possible and within the scope of the present disclosure.

Turning now to FIG. 7, there is shown a schematic of the circuit 200 illustrating a novel sensing scheme according to the present disclosure. Circuit 200 includes a memory cell 10 according to the present disclosure being connected to a column decoder element 290 and a sense amplifier 295.

The present circuit 200 is shown including a first word line 205 and a second word line 210. The first word line 205 is connected to a node 215. The second word line 210 is connected to a first element 220, which is a select element 220. Select element 220 is a Field effect transistor. Select element 220 is preferably an n type element. The FET 220 can be constructed from a number of semiconductors, preferably silicon and is made with conventional bulk semiconductor processing techniques, using the single crystal semiconductor wafer as the active region, or channel. The FET 220 has a gate, drain, and source terminal that correspond roughly to the base, collector, and emitter.

A gate capacitor element 225 is provided and connected to the node 215 and the first word line 205. The gate capacitor element 225 is also connected to a node 250. Gate capacitor element 225 is also a Field effect transistor 225 but can be a different element that is the equivalent of a gate capacitor element after being programmed. First element 220 or select element 220 is connected to the node 250 and the gate capacitor element 225. The first element 220 is also connected to node 255. Node 255 is connected to a first bit line B 260.

A second device 270 is a sense device 270. Second device 270 is preferably a Field effect transistor. The sense device 270 is of the n type. The sense device 270 is connected to the second bit line 265 by node 280. The sense device 270 is also connected to the first bit line 260 by the node 275. Node 275 is connected to the node 255. The second sense device 270 is connected to the column decoder 290. Column decoder 290 is connected to the sense amplifier 295 at node 300.

The column decoder 290 includes a FET of the n type 290b receiving voltage Vdd and an optional p-transistor 290a. The FET 290b of the column decoder 290 is connected to node 300. Node 300 is connected to a sense loading element 305 and an inverter element 310. Various sense amplifier 295 and column decoder 290 configurations are possible and within the scope of the present disclosure.

Because word line voltage WS 210 is zero and if the leakage on node B as defined between node 275 and 280 is small, then the voltage drop between word line WP 205 and element 270 can be small. Therefore, the voltage V(B) on reference numeral B at element 270 is −0.3 volts. In order to turn on transistor 270, the voltage V(B) needs to be larger than 0.4~0.5 v for a reasonable sensing. The cell architecture of FIG. 7, can be operational under Vdd=0.8 v. Because the memory cell 10 read operation is not sensitive to the programming hardness of the cell, both programming current and programming time can be reduced. This will lead to an easier VPP design work. Also, the voltage on node C shown at node 300 can be very close to a full Vdd swing, the sensing circuit can be as rendered as an inverter, as illustrated in FIG. 7. Based on the discussion above, this circuit 200 is quite suitable for low voltage and low power applications.

Figure 8:
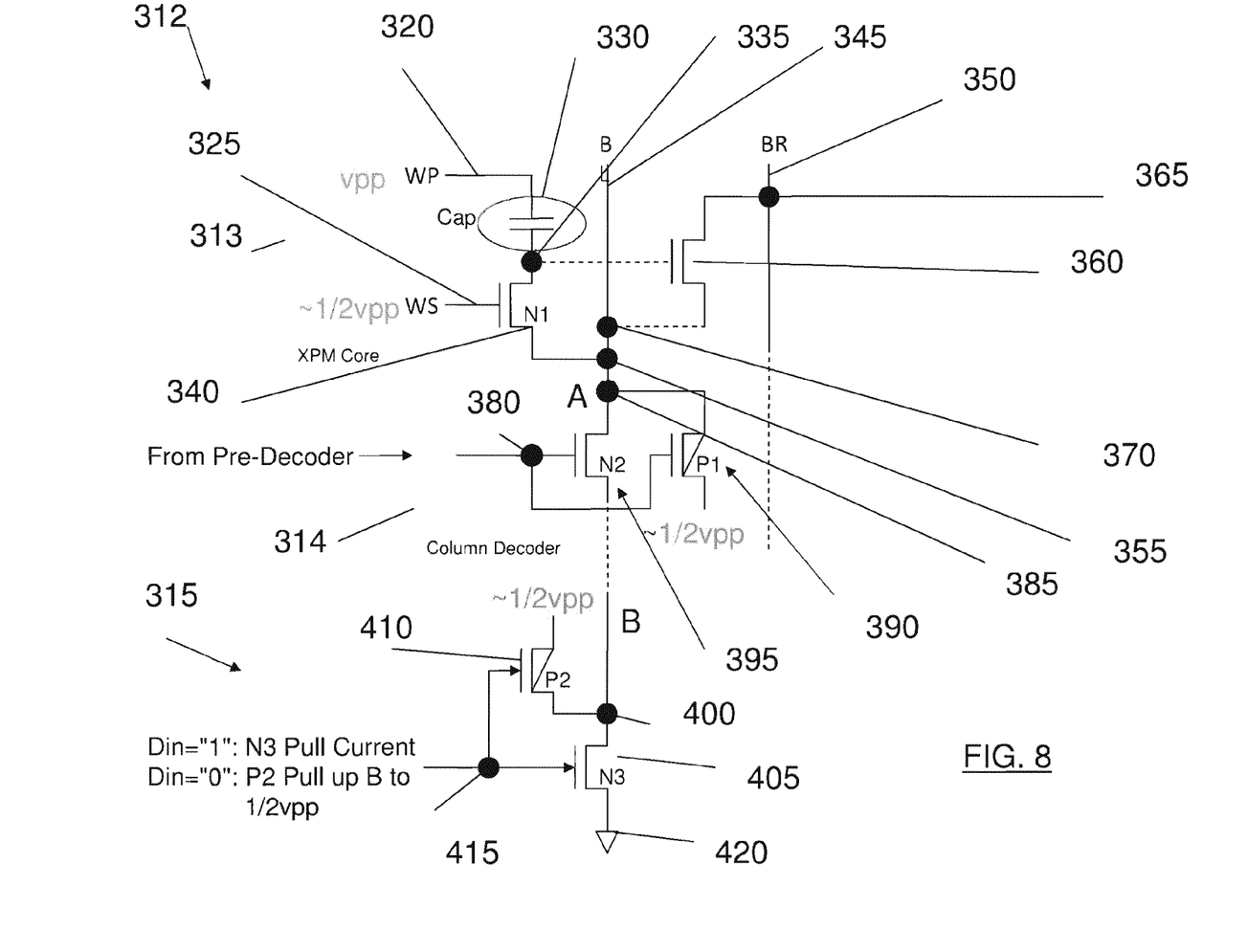
FIG. 8 shows the memory cell being connected to a column decoder and a current limiter for illustrating a protection mechanism.

Turning now to FIG. 8, there is shown a circuit 312 according to the present disclosure including a memory circuit 313 generally being connected to a column decoder circuit 314 and with the decoder circuit 314 being connected to a current limiter circuit 315. The circuit 300 includes a first word line WP 320 and a second word line WS 325. The first word line WP 320 has a voltage of Vpp and the second word line WS 325 includes a voltage of about ½ Vpp. Various voltage levels are possible and these values form no limitations to the present disclosure. The first word line 320 is connected to a gate capacitor element 330. Gate capacitor element 330 is connected to node 335. The node 335 is connected to a first select element 340. Gate capacitor element 330 can be a Field effect transistor or another element. First select element 340 is connected to the second word line WS 325. First select element 340 can be a Field effect transistor of the N type. The circuit 312 also includes a first bit line B 345 and a second bit line BR 350. The first select element 340 is connected to the first bit line B 345 by node 355.

The circuit 300 also includes a second sensing device 360. Second sensing device 360 is connected to the second bit line BR 350 at node 365. Second sensing device 360 is also connected to the first bit line B 345 at node 370. Second sensing device 360 is preferably a Field effect transistor. The second sensing device 360 is also connected to the node 335 and both the select device 340 and gate capacitor element 330.

The column decoder circuit 314 includes an input node 380 that receives an input signal from the pre-decoder circuit (not shown) as is known in the art. The column decoder circuit 314 also includes a node 385 which is connected to the first bit line B 345. The decoder circuit 314 includes an element 395, which is an N type FET 395 connected to the node 385 and the first bit line B 345. The decoder circuit 314 also includes a P type transistor 390 that is connected to node 385. FET 390 receives a voltage of ½ Vpp. The FET 395 is further connected to a current limiter circuit 315 at node 400.

The current limiter circuit 315 includes an N type FET 405 and a P type FET 410. N type FET 405 is connected to node 400 and ground at 420. The P type FET 410 is a Field effect transistor 410 and is connected to node 415. FET 410 receives a voltage of about ½ Vpp. The signals from the pre-decoder circuit (not shown) will turn on or off of the transistors 390 and 395 exclusively. If the cell is in the unselected column, the signal "0" from the pre-decoder will turn off element 395 and turn on the transistor 390. Then, the node 385 will be pulled up to ~½Vpp and the gate capacitor element 330 will be safely protected.

In a single-bit programming with din="0" or in multiple bits programming with all dins="0" being applied to node 415, the program may be terminated. However, if one or more than one cell needs to be programmed in a single programming procedure, then the signal from the pre-decoder, will turn on or off of the transistor elements 410 and 405 exclusively. When din="0", transistor element 410 will pull node 400 to ~½Vpp, and node 385 will be up to ~(½Vpp-Vtn) and the gate element 330 can be safely protected. Preferably, the circuit 312 can work for both bit lines BL and BR 345 and 350 column decoders as well. The present circuit 312 can be applied to column decoding schemes and other device types as is known in the art.

Figure 9:
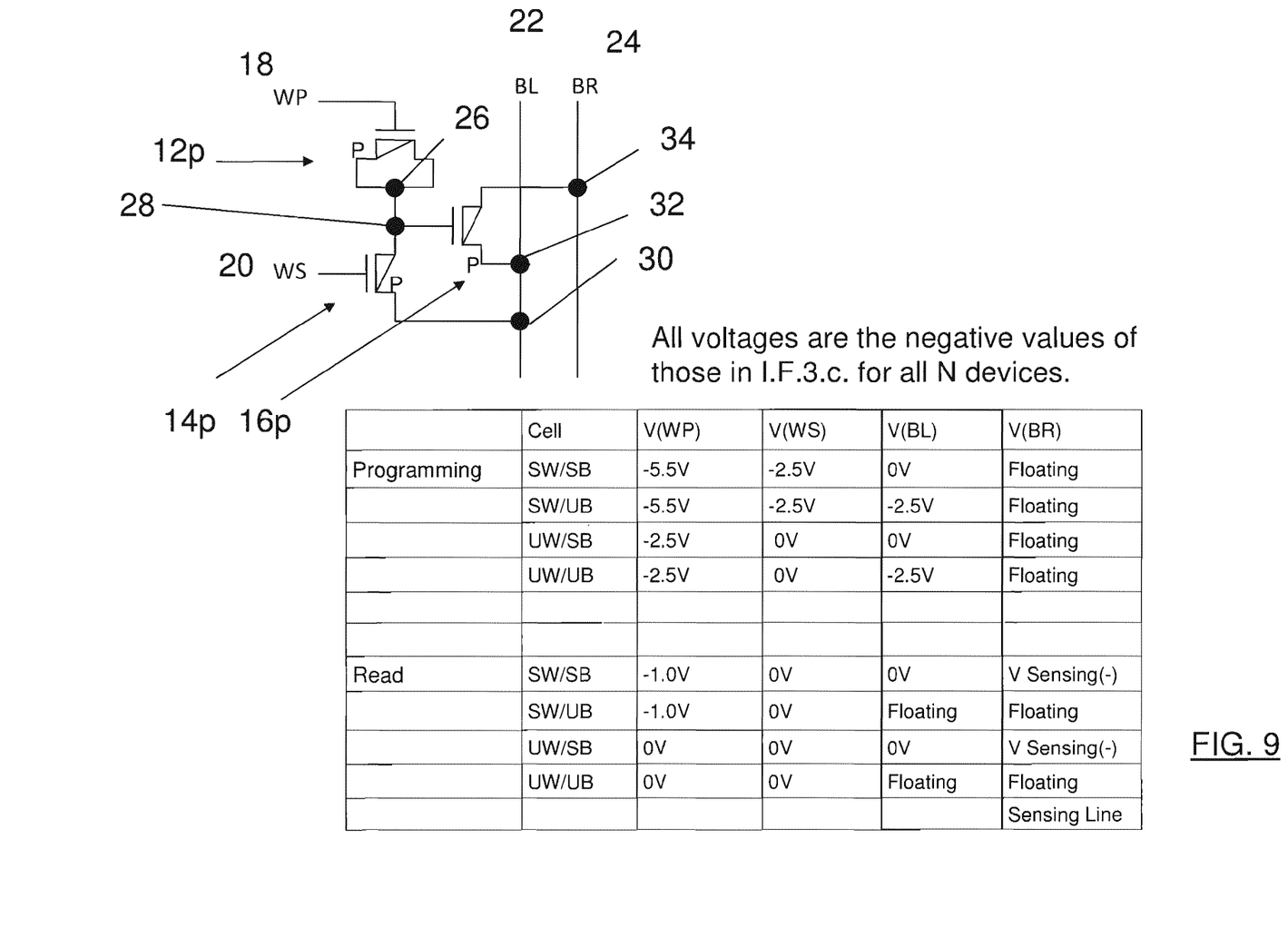
FIG. 9 shows a table of operational voltage conditions for the memory cell of FIG. 3B.

FIG. 9 shows a number of operation voltage values for the configuration of FIG. 3B where FETs 12p, 14p and 16p are implemented with P type devices only with the N wells tied to ground. It should be appreciated that the operational voltage values are only illustrative of one embodiment of the present disclosure and form no limitations as other operational voltage values are possible and within the scope of the present disclosure.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof, means any connection or coupling, either direct or indirect, between two or more elements; the coupling of connection between the elements can be physical, logical, or a combination thereof.

Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize.

Changes can be made to the invention in light of the above Detailed Description. While the above description describes certain embodiments of the invention, and describes the best mode contemplated, no matter how detailed the above appears in text, the invention can be practiced in many ways. Details of the compensation system described above may vary considerably in its implementation details, while still being encompassed by the invention disclosed herein.

As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific embodiments disclosed in the specification, unless the above Detailed Description section explicitly defines such terms. Accordingly, the actual scope of the invention encompasses not only the disclosed embodiments, but also all equivalent ways of practicing or implementing the invention under the claims.

All of the above patents and applications and other references, including any that may be listed in accompanying filing papers, are incorporated herein by reference. Aspects of the invention can be modified, if necessary, to employ the systems, functions, and concepts of the various references described above to provide yet further embodiments of the invention.

While this invention has been particularly shown and described with references to a preferred embodiment thereof, it will be understood by those skilled in the art that is made therein without departing from the spirit and scope of the invention as defined by the following claims.

What is claimed is:

1. A memory circuit comprising:
   at least two word lines;
   at least two bit lines;
   a first select device being connected to at least one word line and one bit line;
   a gate capacitor element connected to at least one word line and the first select device; and
   a sense device being connected in series to the gate capacitor element and the first select device, the sense device being connected to at least two bit lines;
   wherein the memory circuit is incorporated into an RFID circuit.

2. A memory circuit comprising:
   at least two word lines;
   at least two bit lines;
   a first select device being connected to at least one word line and one bit line;
   a gate capacitor element connected to at least one word line and the first select device; and
   a sense device being connected in series to the gate capacitor element and the first select device, the sense device being connected to at least two bit lines;
   wherein in an unprogrammed memory cell, the first select device off leakage current is larger than a gate capacitor element tunneling current to provide a gate of first sense device to about 0V to provide the memory circuit in the off state; and
   wherein in a programmed memory circuit, the gate leakage current is larger than the off leakage current of the first select device to program a sense device gate and to switch on the programmed memory circuit.

3. A memory circuit comprising:
   at least two word lines;
   at least two bit lines;
   a first select device being connected to at least one word line and one bit line;
   a gate capacitor element connected to at least one word line and the first select device; and
   a sense device being connected in series to the gate capacitor element and the first select device, the sense device being connected to at least two bit lines;
   wherein gate capacitor element is a field effect transistor, and wherein to program the memory circuit and breakdown a gate oxide of the field effect transistor a current of about 1 to about 5 µA is required; and
   wherein to sense the memory circuit the current is about 1 nA; and
   wherein the first select device has a source to drain resistance that is relatively larger than about 100M ohms in an off state;
   wherein the programming voltage is about zero volts and wherein in a programmed breakdown gate oxide a resistance is less than about 10M ohms; and
   further comprising a resistor voltage divider being formed by a programmed capacitor and the off state first select device to turn on the sense device.

4. A memory circuit comprising:
   a first word line;
   a second word line;
   a first bit line;
   a second bit line;

a first select device being connected to the second word line and the first bit line;
a gate capacitor element connected to the first word line and the first select device;
a sense device being connected in series to the gate capacitor element and the select device, the sense device being connected to the first bit line and the second bit line;
a decoder circuit being connected to the sense device and the first select device;
a current limiting circuit being connected to the decoder circuit; and
wherein the gate capacitor element is a field effect transistor, the first select device is a field effect transistor, and the sense device is a field effect transistor.

* * * * *